United States Patent [19]

Heywang

[11] Patent Number: 4,763,979
[45] Date of Patent: Aug. 16, 1988

[54] ARRANGEMENT FOR COUPLING A LASER DIODE TO A MONOMODE LIGHT WAVEGUIDE AND THE METHOD FOR FORMING THE ARRANGEMENT

[75] Inventor: Walter Heywang, Neukeferloh, Fed. Rep. of Germany

[73] Assignee: Siemens Aktiengesellschaft, Berlin and Munich, Fed. Rep. of Germany

[21] Appl. No.: 910,464

[22] Filed: Sep. 23, 1986

[30] Foreign Application Priority Data

Sep. 24, 1985 [DE] Fed. Rep. of Germany ....... 3534017

[51] Int. Cl.⁴ .......................... G02B 6/36; H01S 3/00; H01J 5/16
[52] U.S. Cl. .............................. 350/96.20; 350/96.10; 350/96.15; 350/96.17; 350/320; 372/37; 372/43; 372/45; 372/29; 250/227
[58] Field of Search ............... 350/96.10, 96.15, 96.17, 350/96.20, 96.21, 320; 372/29, 44, 45, 37; 357/27; 250/227

[56] References Cited

U.S. PATENT DOCUMENTS

| | | | |
|---|---|---|---|
| 3,803,511 | 4/1974 | Thompson | 350/96.15 X |
| 3,938,895 | 2/1976 | Bridger et al. | 350/96.20 X |
| 4,594,718 | 6/1986 | Scifres et al. | 372/45 |
| 4,601,535 | 7/1986 | Tanaka et al. | 350/96.20 |
| 4,630,278 | 12/1986 | Auffret et al. | 372/43 |
| 4,636,032 | 1/1987 | Grego | 350/96.20 |
| 4,673,244 | 6/1987 | Miles | 350/96.20 |
| 4,679,908 | 7/1987 | Goodwin | 350/320 |
| 4,688,885 | 8/1987 | Poteat et al. | 350/96.20 |
| 4,702,556 | 10/1987 | Ishii et al. | 350/320 |

FOREIGN PATENT DOCUMENTS

| | | | |
|---|---|---|---|
| 57-46219 | 3/1982 | Japan | 350/96.20 |
| 58-158619 | 9/1983 | Japan | 350/96.15 |
| 60-117206 | 6/1985 | Japan | 350/96.15 |

OTHER PUBLICATIONS

Oirschot et al., "Ridged Substrate Internally Diffused Stripe . . . " Appl. Phys. Lett. vol. 43 No. 9, 11/83, pp. 809–811.

Primary Examiner—William L. Sikes
Assistant Examiner—Brian M. Healy
Attorney, Agent, or Firm—Hill, Van Santen, Steadman & Simpson

[57] ABSTRACT

An arrangement for coupling a light waveguide, such as a monomode glass fiber to a laser diode and a method of forming the coupling characterized by the laser diode being an integrated part of a semi-conductor chip having a mirrored step projecting out of a seating surface for the monomode glass fiber. The mirrored step defines an end face of the diode from which the laser beam emerges and the seating surface extends parallel to the laser active layer of the diode and at such an interval from the layer that the light entry face of the one end of the waveguide laying flat on the seating surface lies at the same height as the exit point of the beam. The method includes securing the fiber forming the waveguide on the seating surface, and then applying an external magnetic field to the diode to displace and pivot the beam in the laser active layer to adjust the beam relative to the fiber.

13 Claims, 1 Drawing Sheet

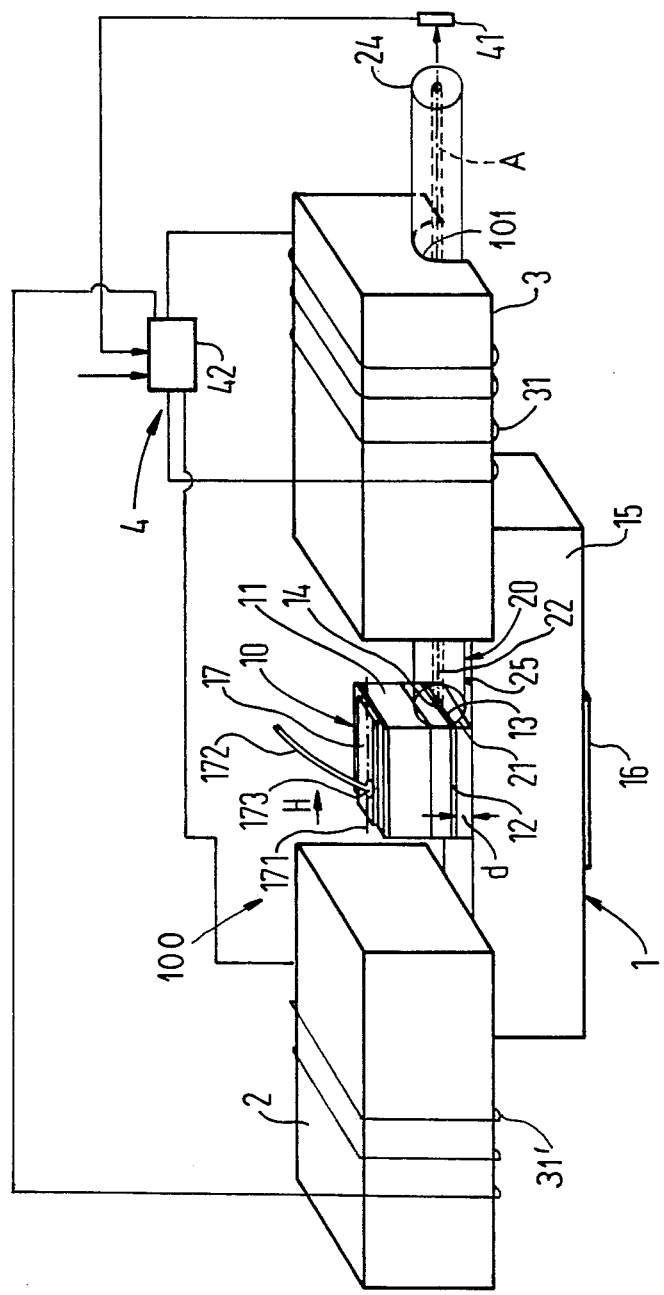

ARRANGEMENT FOR COUPLING A LASER DIODE TO A MONOMODE LIGHT WAVEGUIDE AND THE METHOD FOR FORMING THE ARRANGEMENT

BACKGROUND OF THE INVENTION

The present invention is directed to an arrangement of a laser diode being coupled to a monomode light waveguide and to the method of forming this arrangement.

A method for coupling a laser diode to a monomode light waveguide wherein the laser beam emerging from the end face of the laser diode and end face of the light waveguide are adjusted to one another by means of relative cross sectional displacement and pivoting is especially critical with respect to the adjustments because of the small dimension of the light conducting region of the monomode waveguide. Since there are four degrees of freedom in the adjustment of the laser beam emerging from the light exit face of the laser diode relative to the light waveguide, these four degrees of freedom must be defined by adjustment, which are mainly in two coordinates and two angles. Up to now, the adjustment was undertaken by means of a purely mechanical-optical fine adjustment wherein the coordinates were defined by relative cross displacement and the angles were defined by relative pivoting of the laser diode and of the light waveguide.

SUMMARY OF THE INVENTION

The object of the present invention is to provide an arrangement of a laser diode coupled to a monomode light waveguide and a method of forming the coupling, wherein adjustments need be carried out to only one coordinate and to only one angle and can be undertaken in a very simple way. The method is accomplished by an improvement in a method of coupling a laser diode to a monomode light waveguide wherein the laser beam emerging from an end face of the laser diode and an end face of the light waveguide are adjusted to one another by means of relative cross-displacement and pivoting. The improvement is that a gain guided laser diode is provided, a seating surface for the light waveguide which is parallel to the laser active layer of the diode is provided and fixed relative to a front of the reflecting end face so that a light waveguide laying flat on the seating surface lies on the same level as the exit point of the laser beam from the laser diode, securing the light waveguide on the seating surface and displacing and pivoting the laser beam in the plane of the laser active layer by means of an external magnetic field applied to the diode to adjust the beam relative to the light waveguide.

One coordinate and one angle for the light waveguide to be mounted are correctly perscribed by the provision of the seating surface. These are of the proper height for the light entry face of the light waveguide relative to the exit point of the laser beam and the vertical correct alignment of the light waveguide relative to the plane of the laser active layer. The other two degrees of freedom are horizontally defined relative to the laser active layer whereby one is satisfied with a rough adjustment and the fact is exploited that given a "gain guided" laser diode, which is discussed in *Applied Physics Letter*, 43 (9), 1 Nov. 1983, pages 809–810, the active zone in a laser active layer can be displaced by means of an external magnetic field so that both electrons as well as the holes are repulsed in the same direction on their way to the active zone. Thus, the exit point of the laser beam can be shifted in a longitudinal direction of the strip-shaped light exit surface of the laser diode and is shifted by means of a uniform magnetic field parallel to the light ray. The direction of the emerging laser beam changes when the absolute size of this magnetic field changes within the laser diode.

Following thereupon, the light waveguide is first fixed on the seating surface in accordance with the step of securing the waveguide and the rough adjustment is obtained by means of applying the external magnetic field.

Preferably, the reflecting end face of the laser diode is formed by a step projecting out of the seating surface.

Advantageously, the diode is an integral part of a semi-conductor chip which has a mirrored step defining the end face of the diode.

In accordance with the development of the invention, the magnetic field including its gradient is set by two permanent magnets mechanically displaced relative to one another and being positioned after the light waveguide is fixed on the seating surface. To compensate for misadjustments which, for example, are due to thermal dislocations during operation, the magnetic field can be readjusted by one of the magnets being provided with a coil which is energized to change the magnetic characteristic of the magnets. Preferably, the magnetic field is readjusted by means of at least one coil which is part of a control loop controlled by an optical output power from the light waveguide.

In addition to the method of forming the coupling, an arrangement comprising the light diode and the monomode light waveguide coupled thereto is obtained. This arrangement includes an improvement to a coupling having a light entry face at one end of the light waveguide lying opposite an exit point of the laser beam emerging from the end face of the diode, said laser beam being aligned approximately in axial direction of the light waveguide. The improvements are that a gain guided laser diode is provided and has a reflective end face with a seating surface for the light waveguide extending therefrom in a fixed relationship to the end face and parallel to the laser active layer of the diode. The end face is at an interval from the layer that corresponds to the light waveguide so that when the light waveguide is secured on the seating surface, it is at the same level as the exit point of the laser beam.

The arrangement also includes means for generating an external magnetic field being applied to the diode for shifting and pivoting the laser beam in a plane of the laser active layer. Besides having at least coil on one of the two permanent magnets forming the means for creating a magnetic field, both magnets can be provided with the coil if desired with the flow of the current in the coils being controlled by the output power from the light waveguide.

BRIEF DESCRIPTION OF THE DRAWINGS

The FIGURE is a perspective view of an arrangement coupling a guided laser diode in a monomode glass fiber with the control loop and coil on the magnets being schematically illustrated.

DESCRIPTION OF THE PREFERRED EMBODIMENTS

The principles of the present invention are particularly useful in an arrangment generally indicates at 100 in the FIGURE. The arrangement 100 includes a laser diode 10 which is formed as an integral part of a semi-conductor chip 1 which has a semi-conductor substrate 15. A reflective end face 11 for the laser diode 10 is defined by a mirrored step projecting out of a base area 25 forming a seating surface and this step can be generated by etching a diode out of the semi-conductor substrate 15.

As known, the laser light in the laser diode 10 is generated in a laser active layer 12, which given a gain guided laser diode can extend over the entire region of the laser diode. The laser light is generated in the laser active zone of this layer 12 which is limited to the region of this layer which is permeated by current having an adequate density.

Given the illustrated laser diode, the active zone and the laser active layer 12 is limited roughly to the strip-shaped regions below the strip-shaped electrode 17 which cooperates with an electrode 16 on the substrate 15. Accordingly, light does not emerge from the entire available light exit face 13 of the laser active layer 12 which lies in the mirrored end face 11 of the laser diode 10 but only emerges in a sub-region 14 of this light exit surface 13. The sub-region 14 also represents a laser beam emerging in the plane of the laser active material and this laser beam is aligned parallel to a longitudinal direction 171 of the oblong, strip-shaped electrode 17, which is connected at a contact location 173 to a lead wire 172.

By means of a uniform magnetic field H extending parallel to the laser beam, the strip-shaped active zone in the laser-active layer 12 can be dislocated parallel so that the spot 14 and thus, the exit point of the laser beam lying in the center thereof, shift in a longitudinal direction of the oblong strip-shaped light exit surface 13. The direction of the laser beam can be changed horizontally relative to the plane of the laser active layer 12 by means of an inhomogeneous magnetic field, wherein the amount of the field vector in the region of the laser diode changes.

For coupling the monomode glass fiber 20 to the laser diode 10, it is seen that the vertical spacing d of the seating surface 25 from the laser active layer 12 corresponds to the radius of the glass fiber 20 and that the seating surface 25 extends parallel to the laser active layer 12 and thus, to the direction of the laser beam. For coupling the glass fiber to the laser diode 20, the fiber has its outside generated surface placed on and fixed to the seating surface 25 with its one end 21 of the fiber lying against the mirrored end face 11 of the laser diode and a longitudinal axis A of the fiber being aligned more or less parallel to the direction of the laser beam. The fixed fiber 20 is already correctly aligned vertically relative to the plane of the laser active layer 12 and the light entry face at the end 21 of the fiber 20 defined by its core 23 lies at the same height as the laser exit face 13 so that these surfaces lie opposite one another. For the adjustment parallel to the plane of the laser active layer 12, an external magnetic field H is applied to the laser diode 10. This field H including its gradient is set by two mechanically displaceable permanent magnets 2 and 3 after the fiber 20 has been secured to the semi-conductor chip 1. The magnet 3, which overlies the fiber, has a recess 101 for the fiber 20. The magnetic field H is set such that the laser beam is aligned with the light entry face of the fiber 20 and parallel to an axis A of the fiber so that a rough adjustment is adequate here.

For compensation of maladjustments, which, for example, are due to thermal dislocation during operation, the magnetic field H can be readjusted. This is accomplished by a coil 31 being provided on the magnet 3 and this coil is part of a control loop 4 controlled by the optical output power at another end 24 of the fiber 20. For this purpose, the output power of the other end 24 is measured with a photodetector 41 and the measured value is supplied to a regulator 42 as an actual value and this regulator 42 comparing the actual value to a rated value and subsequently readjusts the magnetic field H by regulating the voltage or, respectively, the current through the coil 31. Coils for readjustment of the magnetic field can also be provided on both magnets 2 and 3 and these coils, which are identified by coils 31 and 31' in the FIGURE, are then part of the control loop controlled by the optical output power.

Although various minor modifications may be suggested by those versed in the art, it should be understood that I wish to embody with the scope of the patent granted hereon, all such modifications as reasonably and properly come within the scope of my contribution to the art.

I claim:

1. In a method for coupling a laser diode to an end of a monomode light waveguide wherein the laser beam emerging from the end face of the laser diode and the end of the light waveguide are adjusted to one another by means of a relative cross-displacement and pivoting, the improvements comprising the providing a laser diode, which is a gain guided laser diode, having a seating surface for the light waveguide extending parallel to a laser active layer of the diode and being rigidly fixed relative to a front of a reflecting end face of the diode at such an interval from the layer that the light entry face at the end of a light waveguide lying flat on the seating surface lies on the same level as the exit point of the laser beam; securing the light waveguide on the seating surface with the end having the light entry face being in contact with the laser active layer; and then displacing and pivoting the laser beam in the plane of the laser active layer by applying an external magnetic field to the diode to thereby adjust the beam position in said laser active layer relative to the light waveguide.

2. In a method according to claim 1, wherein the reflecting end face of the laser diode is defined by a step projecting out of the seating surface.

3. In a method according to claim 1, wherein the laser diode is an integral part of a semi-conductor chip and wherein the reflecting end face is a mirrored step extending from the seating surface on the chip.

4. In a method according to claim 1, wherein the step of applying the magnetic field including its gradient is obtained by providing two permanent magnets, mechanically displacing the magnet relative to one another and the diode and then securing the magnet in the arrangement subsequent to securing the waveguide on the seating surface.

5. In a method according to claim 4, which includes readjusting the magnetic field by providing at least one coil on at least one of the permanent magnets and passing an electrical current through the coil.

6. In a method according to claim 5, wherein the step of passing a current through the coil includes providing a control loop having means for sensing the optical output from the light waveguide and includes sensing the optical output of the waveguide with said means for sensing, and controlling the current in the coil in response to the sensed optical output power.

7. In an arrangement comprising a laser diode and a monomode light waveguide coupled thereto with the light entry face of the one end of the light waveguide lying opposite an exit point of the laser beam emerging from an end face of the laser diode, said laser diode being aligned approximately in an axial direction of said light waveguide, the improvements comprising the laser diode being a gain guided laser diode having a laser active layer, reflective end face and a seating surface for said light waveguide being fixed relative to said end face and extending parallel to the laser active layer of said diode at an interval from the layer corresponding to the radius of the optical waveguide, the light waveguide being secured and lying flat on the seating surface with the light entry face of the core of the light waveguide laying at the same level as the exit point of the laser beam from the laser active layer, and means for generating an external magnetic field being applied to the diode for shifting and pivoting the laser beam in the plane of the laser active layer.

8. In an arrangement according to claim 7, wherein the reflective end face of the laser diode is defined by a step projecting from the seating surface.

9. In an arrangement according to claim 8, wherein the laser diode is an intregral part of a semi-conductor chip having the reflecting end face being a mirrored step extending from an integral seating surface.

10. In an arrangement according to claim 7, wherein the means for generating the magnetic field comprises two permanent magnets which are mechanically displaceable relative to one another and are positioned with the diode being arranged therebetween.

11. In an arrangement according to claim 10, wherein the means for generating the magnetic field includes at least one coil on one of the magnets to enable adjusting the magnetic field.

12. In an arrangement according to claim 11, which includes controls for controlling the flow of electrical current in the coil including a control loop having means for sensing an optical output power from the light waveguide and a control varying the current in response to the sensed output power.

13. In an arrangement according to claim 12, which includes a coil on each of the two magnets, said coils being controlled by the control loop in response to the sensed optical output power on the light waveguide.

* * * * *